(12) United States Patent
Shchekin et al.

(10) Patent No.: US 8,104,907 B2
(45) Date of Patent: Jan. 31, 2012

(54) REMOTE WAVELENGTH CONVERTING MATERIAL CONFIGURATION FOR LIGHTING

(75) Inventors: Oleg B. Shchekin, San Francisco, CA (US); Serge J. Bierhuizen, Santa Rosa, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 351 days.

(21) Appl. No.: 12/432,521

(22) Filed: Apr. 29, 2009

(65) Prior Publication Data
US 2010/0277950 A1 Nov. 4, 2010

(51) Int. Cl.
*F21V 33/00* (2006.01)
(52) U.S. Cl. .......................................... 362/84
(58) Field of Classification Search ............ 362/84
See application file for complete search history.

(56) References Cited

U.S. PATENT DOCUMENTS

| | | | |
|---|---|---|---|
| 6,844,903 B2 | 1/2005 | Mueller-Mach et al. | |
| 6,974,229 B2 | 12/2005 | West et al. | |
| 7,052,152 B2 | 5/2006 | Harbers et al. | |
| 7,070,300 B2 | 7/2006 | Harber et al. | |
| 7,201,493 B2 | 4/2007 | Martynov et al. | |
| 7,234,820 B2 | 6/2007 | Harbers et al. | |
| 7,248,310 B2 | 7/2007 | Mueller-Mach et al. | |
| 7,267,469 B2 | 9/2007 | Keuper | |
| 7,364,343 B2 | 4/2008 | Keuper et al. | |
| 7,937,865 B2 * | 5/2011 | Li et al. | 40/542 |
| 2007/0025098 A1 * | 2/2007 | Kim et al. | 362/97 |
| 2008/0253107 A1 * | 10/2008 | Lin | 362/84 |
| 2009/0034230 A1 * | 2/2009 | Lim et al. | 362/84 |
| 2009/0045420 A1 | 2/2009 | Eng et al. | |

FOREIGN PATENT DOCUMENTS

| | | |
|---|---|---|
| EP | 1577609 A1 | 9/2005 |
| JP | 2000285718 | 10/2000 |
| WO | 2009004511 A1 | 1/2009 |
| WO | 2009017794 A1 | 2/2009 |
| WO | 2009022315 A2 | 2/2009 |

* cited by examiner

*Primary Examiner* — Laura Tso

(57) ABSTRACT

A device includes a reflector and a wavelength converting material disposed on the reflector. A backlight is disposed between the reflector and a surface to be illuminated, such as a liquid crystal display panel. The backlight includes a light source and a waveguide. The waveguide is configured to direct a majority of light from the light source toward the reflector. At least a portion of the light is converted by the wavelength converted material, reflected by the reflector, and incident on the surface to be illuminated.

20 Claims, 4 Drawing Sheets

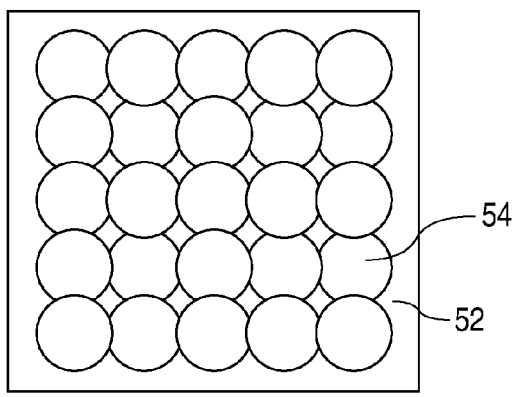
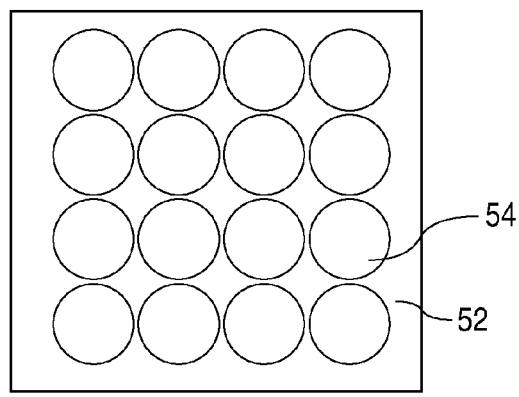
FIG. 7　　　　　　FIG. 8
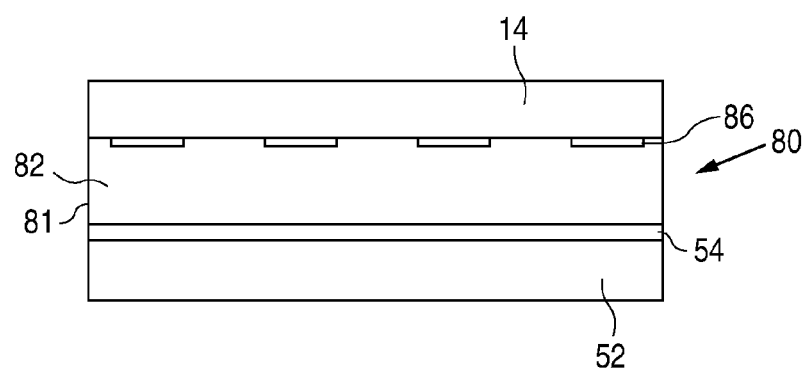
FIG. 9

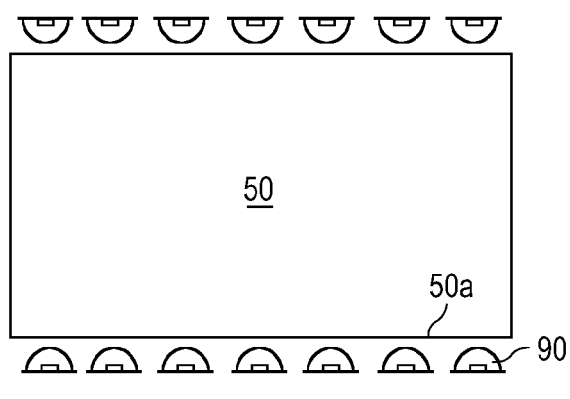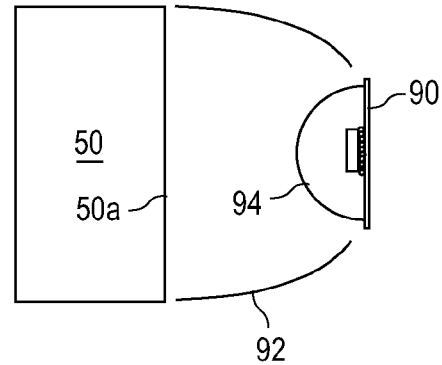
FIG. 10          FIG. 11

US 8,104,907 B2

REMOTE WAVELENGTH CONVERTING MATERIAL CONFIGURATION FOR LIGHTING

FIELD OF INVENTION

The invention relates to the field of lighting devices, and more specifically to a lighting device with a wavelength converting material spaced apart from a light source.

BACKGROUND

Semiconductor light emitting devices such as light emitting diodes (LEDs) are among the most efficient light sources currently available. Material systems currently of interest in the manufacture of high brightness LEDs capable of operation across the visible spectrum include group III-V semiconductors, particularly binary, ternary, and quaternary alloys of gallium, aluminum, indium, and nitrogen, also referred to as III-nitride materials; and binary, ternary, and quaternary alloys of gallium, aluminum, indium, arsenic, and phosphorus. Often III-nitride devices are epitaxially grown on sapphire, silicon carbide, or III-nitride substrates and III-phosphide devices are epitaxially grown on gallium arsenide by metal organic chemical vapor deposition (MOCVD), molecular beam epitaxy (MBE), or other epitaxial techniques. Often, an n-type region is deposited on the substrate, then a light emitting or active region is deposited on the n-type region, then a p-type region is deposited on the active region. The order of the layers may be reversed such that the p-type region is adjacent to the substrate.

One promising use of semiconductor light emitting devices is for backlights for general illumination and display devices such as liquid crystal displays (LCDs). LCDs are commonly used in cellular phones, personal digital assistants (PDAs), portable music players, laptop computers, desktop monitors, and television applications. One embodiment of the present invention deals with a color or monochrome, transmissive LCD that requires backlighting, where the backlight may use one or more LEDs. LEDs are distinguished from laser diodes in that the LEDs emit incoherent light.

The backlight illustrated in FIG. 1 is described in U.S. Pat. No. 7,052,152, which is incorporated herein by reference. An array of LEDs 24 is placed on the rear panel of the backlight 26. The back plane 48 and sidewalls 46 of the backlight 26 are covered with highly reflective materials. LCD panel 14 is placed in front of backlight 26. LCD panel 14 may be a conventional LCD, having a first polarizing filter, a thin film transistor array for developing an electric field across selected areas of the liquid crystal layer, a liquid crystal layer, an RGB color filter array, and a second polarizing filter. The color filter array has red, green and blue subpixels. Between the LCD panel 14 and the backlight 26, additional films can be used, such as a brightness enhancement film (BEF) or polarization recovery film (DBEF).

A color converting phosphor layer 39 is disposed on a cover plate 40. The phosphor layer 39 is a uniform layer, consisting of one or more different types of phosphor. Preferably, a green and a red phosphor are used, but a yellow phosphor (YAG) could be used as well. This layer 39 can be applied by spray painting, screen-printing, or electrophoretic deposition, or might be a film with uniform density of particles or a luminescent dye distributed throughout the film. As an alternative to a single phosphor layer, one type of phosphor is applied to cover plate 40, while another phosphor is applied to the rear panel 48 of the backlight. The phosphor on rear panel 48 may be applied not as a uniform coating, but as a dot pattern.

SUMMARY

It is an object of the invention to provide a lighting device with a wavelength converting material spaced apart from the light source. In accordance with the invention, a device includes a reflector and a wavelength converting material disposed on the reflector. A backlight is disposed between the reflector and a surface to be illuminated, such as, for example, a liquid crystal display. The backlight includes a light source and a waveguide. The waveguide is configured to direct a majority of light from the light source toward the reflector. At least a portion of the light is converted by the wavelength converted material, reflected by the reflector, and incident on the surface to be illuminated.

BRIEF DESCRIPTION OF THE DRAWINGS

FIGS. 7 and 8 illustrate wavelength converting material disposed on a reflector.

FIG. 9 is a cross sectional view of a lighting device according to embodiments of the invention.

FIG. 10 is a top view of a transparent waveguide with LEDs positioned along the edges.

FIG. 11 illustrates an LED disposed along the edge of a transparent waveguide.

DETAILED DESCRIPTION

Figure 2:
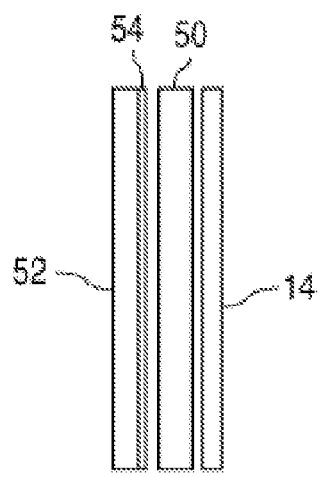
FIG. 2 is a cross sectional view of a lighting device according to embodiments of the invention.

FIG. 2 illustrates a lighting device according to embodiments of the invention. Light is provided by waveguide 50. One suitable backlight is a section of transparent material that functions as a waveguide 50 to mix light provided by several LEDs. The waveguide may be, for example, acrylic (e.g., PMMA), hard silicone, molded plastic, polycarbonate, or any other suitable material. FIG. 10 is a top view of one example of a waveguide 50 with LEDs 90 positioned along the edge 50A. FIG. 11 illustrates an LED 90 on the edge 50a of waveguide 50. Reflective members 92 may direct light from LED 90 into waveguide 50. LED 90 include a dome lens 94.

Figure 3:
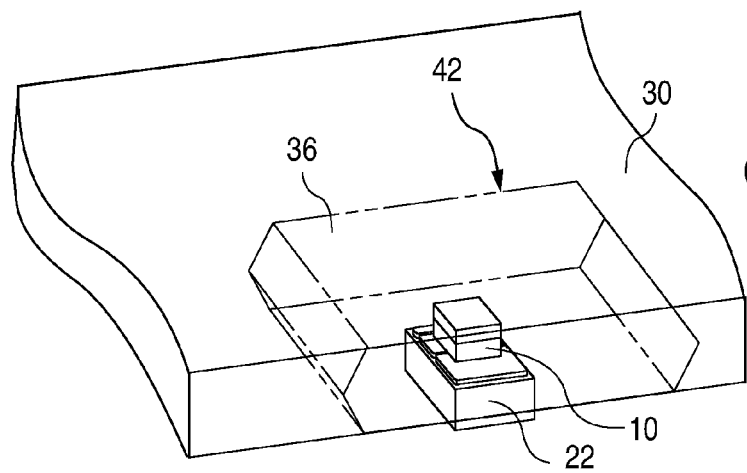
FIG. 3 illustrates a side-emitting LED positioned in an opening in a transparent waveguide.

The LEDs may alternatively be disposed in openings in the waveguide. The openings may be positioned near the edge of the transparent waveguide. One example of such a backlight is illustrated in FIG. 3 and described in US 2009-0045420, which is incorporated herein by reference. A side-emitting LED 10, mounted on a mount 22, is positioned in an opening in a section of solid, transparent waveguide material 36. Waveguide section 36 is positioned in slot 42 of a larger waveguide 30.

Figure 4:
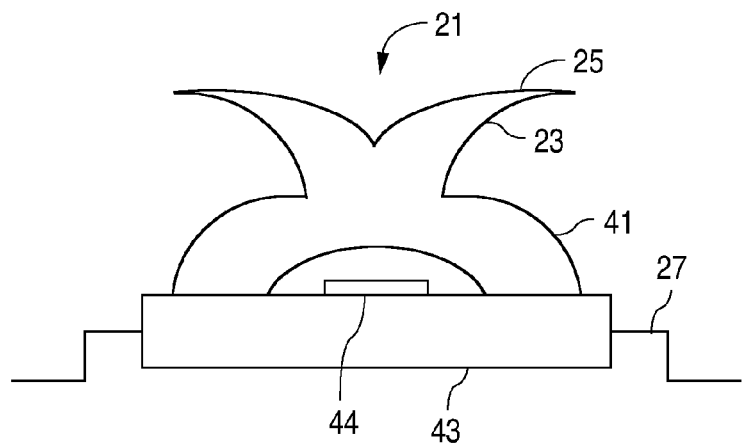

The LEDs emit a majority of light out the side of the device, rather than out the top. One example of a suitable device is illustrated in FIG. 4 and described in more detail in U.S. Pat. No. 6,974,229, which is incorporated herein by reference. The lens 21 over LED 44 is designed such that light emitted into the top section is totally internally reflected on surface 25 such that it is incident on surface 23 and refracted out of the lens. Light emitted into section 41 is also refracted out of the device. Lens 21 is attached to a frame 43. Leads 27 are electrically connected to LED 44.

Figure 5:
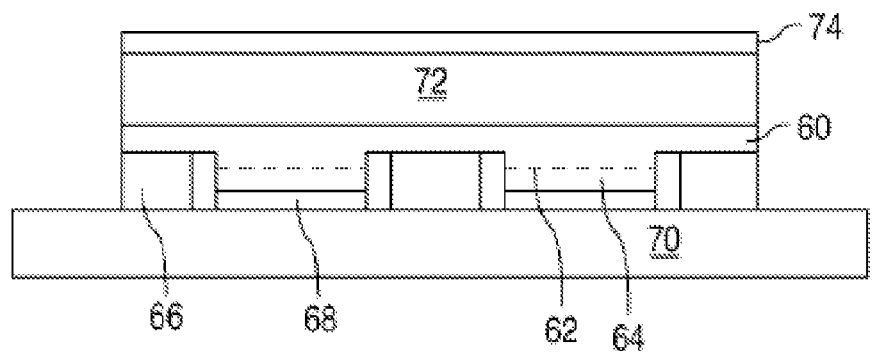
FIGS. 4 and 5 illustrate examples of side-emitting LEDs.

Another example of a suitable side-emitting device is illustrated in FIG. 5. The device of FIG. 5 may be much thinner (i.e. shorter) than the device of FIG. 4. The device of FIG. 5 is formed by first growing an n-type region 60, a light emitting or active region 62, and a p-type region 64 on a growth substrate, such as sapphire, SiC, or GaN (not shown in FIG. 5). Portions of the p-type region 64 and light emitting region 62 are etched to expose portions of the underlying n-type region 60. Metal electrodes which may be reflective, (e.g., silver, aluminum, or an alloy) are then formed on the exposed n- and p-type regions. When the diode is forward biased, the light emitting region 62 emits light at a wavelength determined by the composition of the III-nitride active layer. Forming such LEDs is well known.

The semiconductor LED is then mounted on a mount 70 as a flip chip. Mount 70, may be any suitable material such as, for example, ceramic, aluminum, or silicon. Mount 70 includes metal electrodes that are soldered or ultrasonically welded to the metal electrodes on the semiconductor structure via interconnects, which may be, for example, gold or solder. Interconnects may be omitted if the electrodes themselves can be connected, for example by an ultrasonic weld or any other suitable joint. The multiple metal layers between the semiconductor layers (60, 62, and 64) and mount 70, including electrodes on the semiconductor, electrodes on the mount, and interconnects, are shown in FIG. 5 structure 66 (connected to n-type region 60) and 68 (connected to p-type region 64). Mount 70 acts as a mechanical support, provides an electrical interface between the n- and p-electrodes on the LED chip and a power supply, and provides heat sinking. Suitable mounts are well known.

To reduce the thickness of the LED and to prevent light from being absorbed by the growth substrate, the growth substrate is removed by a method suitable to the substrate, such as etching, chemical-mechanical polishing, or laser melting, where a laser heats the interface of the III-nitride structure and growth substrate, melting a portion of the III-nitride structure and releasing the substrate from the semiconductor structure. In one embodiment, removal of the growth substrate is performed after an array of LEDs are mounted on a submount wafer and prior to the LEDs/submounts being singulated (e.g., by sawing).

After the growth substrate is removed, in some embodiments the remaining III-nitride structure is thinned and/or roughened or patterned, for example with a photonic crystal. A reflective film 74 is formed over the semiconductor structure. The reflective film 74 may be specular or diffusing. A specular reflector may be a distributed Bragg reflector (DBR) formed of organic or inorganic layers. The specular reflector may also be a layer of aluminum or other reflective metal, or a combination of DBR and metal. A diffusing reflector may be formed of a metal deposited on a roughed surface or a diffusing material such as a suitable white paint. The efficiency of the side emission may be increased by adding an optional layer 72 between reflective layer 74 and n-type region 60, such as a clear wave guiding layer or a scattering layer incorporating reflective particles or a roughened/prism surface. A wavelength converting layer such as a phosphor may also be disposed between n-type region 60 and reflector 74.

In one embodiment, the mount 70 has a thickness of about 380 microns, the semiconductor layers have a combined thickness of about 5 microns, the optional layer 72 has a thickness of about 200 microns, and the reflective film 74 has a thickness of about 150 microns, so that the LED plus the mount is less than 1 mm thick. Of course, the LED can be made thicker. The length of each side of the LED is typically less than 1 mm and the LEDs are often square, though they may be any shape.

Returning to FIG. 2, a surface to be illuminated is placed on one side of waveguide 50. Though the embodiments below use the example of an LCD panel 14 as the surface to be illuminated, the invention is not limited to LCD displays and the surface to be illuminated may be any surface including, in the case of a general lighting application, a simple transparent cover. LCD layer 14 may be a conventional LCD, having a first polarizing filter, a thin film transistor array for developing an electric field across selected areas of the liquid crystal layer, a liquid crystal layer, an RGB color filter array, and a second polarizing filter. The color filter array has red, green and blue subpixels. Between the LCD panel 14 and the waveguide 50, additional well-known films can be used, such as a brightness enhancement film or polarization recovery film, as well as a diffuser element to improve uniformity.

A reflector 52 is placed on the other side of waveguide 50. There can be an air gap as shown between reflector 52 and waveguide 50. Reflector 52 may be, for example, a reflective film such as enhanced specular reflector (ESR) film available from 3M corporation, or a rigid material, such as plastic, coated with a reflective material, such as a reflective metal, coating, paint, or dichroic stack. In some embodiments, the reflector is partially transparent to leak some through for illumination applications where light from both sides of the device, i.e. the surface to be illuminated 14 and reflector 52, is desired.

A wavelength converting material 54 such as a phosphor is disposed on a side of reflector 52 closest to backlight 50. For example, when combined with LEDs that emit blue light, wavelength converting material 54 may be a single or multiple yellow-emitting phosphors, a mixture of one or more red-emitting phosphors and one or more green-emitting phosphors, or one or more red-emitting phosphors and one or more green-emitting phosphors formed as discrete layers. When combined with LEDs that emit UV light, blue-emitting phosphor may be added. Additional phosphors that emit light of different colors may be added to achieve desired color characteristics of the combined wavelength converted and unconverted light. In some embodiments, all the wavelength converting material used in the device is disposed on reflector 52, such that no wavelength converting material is disposed between the light sources and the surface to be illuminated. Wavelength converting material 54 may also be embedded in a thin glass layer, which could be reflectively coated.

Figure 6:
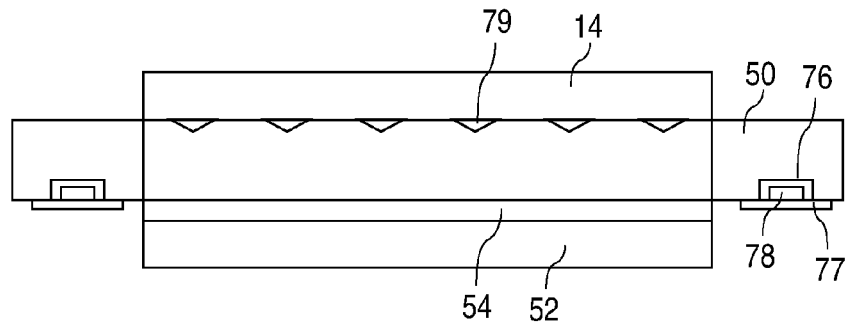
FIG. 6 illustrates a backlight configured to direct light toward a reflector with a wavelength converting material.

The waveguide is configured to direct light from the LEDs toward wavelength converting layer 54, where at least a portion of the light is wavelength converted. For example, in the device illustrated in FIG. 6, in a waveguide 50 as described above including a solid transparent waveguide and side emitting LEDs 77 mounted on mounts 78 and positioned in openings 76 in the waveguide, features 79 are formed in the top of the transparent waveguide to direct light from LEDs 77 away from LCD 14 and toward wavelength converting material 54 on reflector 52. There can be an air gap in between waveguide 50 and wavelength converting layer 54. The wavelength converted light is reflected by reflector 52, mixes with unconverted light, and is incident on LCD 14. An additional diffuser element and/or brightness enhancement film(s) may be located between waveguide 50 and LCD 14.

The amount of wavelength converting material 54 on reflector 52 can be adjusted to tune the color point of the combination of wavelength converted light and unconverted light from the LEDs. FIGS. 7 and 8 illustrate wavelength converting material 54 disposed on two reflectors 52. The wavelength converting material may be, for example, screen printed, spray painted, or stenciled on reflectors 52. Powder phosphors may be mixed with a binder such as silicone or epoxy. Multiple regions of wavelength converting material are disposed on reflector 52 with spaces between neighboring regions. In the device of FIG. 7, the spaces between the regions of wavelength converting material 54 are smaller, thus more light will be converted by the wavelength converting material and the combination of converted and unconverted light will have less unconverted, blue light. In the device of FIG. 8, the spaces between the regions of wavelength converting material 54 are larger, thus less light will be converted by the wavelength converting material and the combination of converted and unconverted light will have more unconverted, blue light.

FIG. 9 illustrates an alternate embodiment of a lighting device with a remote wavelength converting material disposed on a reflector. Backlight 80 includes a waveguide 82, which may be a solid, transparent material or an open box. The sides 81 of waveguide 82 may be made reflective. One or more LEDs 86 are positioned on the surface of waveguide 82 closest to the surface to be illuminated, an LCD 14 in FIG. 9. LEDs 86 may emit a majority of light out the top of the LED, toward wavelength converting material 54 disposed on reflector 52. At least a portion of the light is converted by the wavelength converting material, reflected by reflector 52, mixed with unconverted light, then incident on LCD 14.

Figure 1:
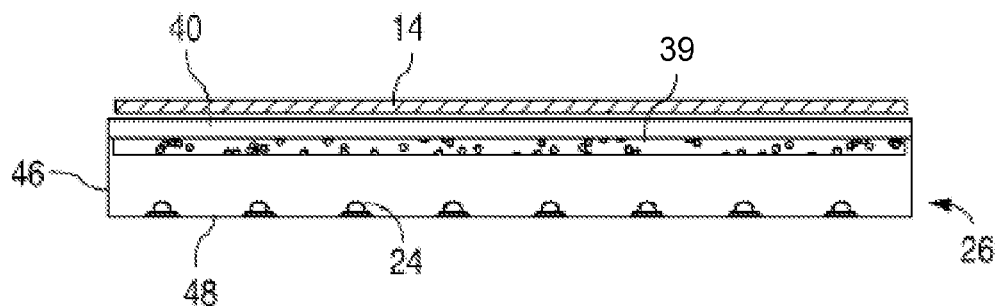
FIG. 1 is a cross sectional view of a display device backlit by an array of semiconductor LEDs.

In the device illustrated in FIG. 1, the backlight is configured to direct light forward, toward LCD 14. Positioning all the wavelength converting material on the back of the backlight would likely result in an insufficient quantity of wavelength converted light, or would reduce the efficiency of the device if light were reflected toward the back of the backlight to be wavelength converted. In contrast, in the devices illustrated in FIGS. 2, 6, and 9, the backlight is configured to direct light from the LEDs back toward the wavelength converting material, rather than forward toward the surface to be illuminated.

The lighting devices with wavelength converting materials disposed on a reflector described above may have several advantages. First, since the wavelength converting material is spaced apart from the LEDs, the efficiency of the wavelength converted material is not reduced by heat from the LEDs. In addition, any heat can be efficiently conducted away from the wavelength converting material by the reflector on which the wavelength converting material is disposed, if the reflector is thermally conductive. Further, absorption by the wavelength converting material may be reduced as compared to a device where light passes through the wavelength converting material, because converted light may travel a shorter distance through the wavelength converting layer.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

What is being claimed is:

1. A device comprising:
   a reflector;
   a wavelength converting material disposed on the reflector;
   a surface to be illuminated; and
   a backlight disposed between the reflector and the surface to be illuminated, the backlight comprising a light source and a waveguide, wherein the waveguide is configured to direct a majority of light from the light source toward the reflector,
   wherein the light source comprises a light emitting diode comprising:
      a III-nitride semiconductor structure comprising a light emitting layer disposed between an n-type region and a p-type region; and
      a reflector positioned over the semiconductor structure.

2. The device of claim 1 wherein:
   the waveguide is a solid, transparent material;
   the light source is a light emitting diode; and
   the light emitting diode is positioned in an opening formed in the transparent material near an edge of the waveguide.

3. The device of claim 2 wherein the waveguide comprises features formed on a surface of the transparent material closest to the surface to be illuminated, wherein the features are configured to direct light toward the reflector.

4. The device of claim 1 wherein:
   the waveguide is a solid, transparent material;
   the light source is a light emitting diode; and
   the light emitting diode is positioned proximate an edge of the waveguide.

5. A device comprising:
   a reflector;
   a wavelength converting material disposed on the reflector;
   a surface to be illuminated; and
   a backlight disposed between the reflector and the surface to be illuminated, the backlight comprising a light source and a waveguide, wherein the waveguide is configured to direct a majority of light from the light source toward the reflector, wherein:
   the waveguide comprises a volume enclosed by reflective sides and filled with air;
   the light source is a light emitting diode; and
   the light emitting diode is positioned proximate a boundary of the waveguide closest to the surface to be illuminated.

6. The device of claim 5 wherein the light emitting diode is positioned to emit light toward the reflector.

7. The device of claim 1 wherein the wavelength converting material is disposed on the reflector in a plurality of regions, wherein neighboring regions are separated by regions of the reflector on which no wavelength converting material is disposed.

8. The device of claim 1 wherein the light source comprises a light emitting diode comprising a semiconductor structure, and no wavelength converting material is positioned between the semiconductor structure and the surface to be illuminated.

9. The device of claim 1 wherein the reflector is thermally conductive.

10. The device of claim 1 wherein the light source is configured to emit blue light and the wavelength converting material comprises at least one phosphor configured to absorb blue light and emit green light and at least one phosphor configured to absorb blue light and emit red light.

11. The device of claim 10 wherein the at least one phosphor configured to absorb blue light and emit green light and the at least one phosphor configured to absorb blue light and emit red light are mixed and disposed on the reflector in a single, uniform layer.

12. The device of claim 10 wherein the at least one phosphor configured to absorb blue light and emit green light and the at least one phosphor configured to absorb blue light and emit red light are disposed on the reflector as discrete layers.

13. The device of claim 1 wherein the light source is configured to emit blue light and the wavelength converting material comprises at least one phosphor configured to absorb blue light and emit yellow light.

14. The device of claim 1 wherein the surface to be illuminated is a liquid crystal display.

15. The device of claim 5 wherein the wavelength converting material is disposed on the reflector in a plurality of regions, wherein neighboring regions are separated by regions of the reflector on which no wavelength converting material is disposed.

16. The device of claim 5 wherein the reflector is thermally conductive.

17. A device comprising:
   a reflector;
   a wavelength converting material disposed on the reflector;
   a surface to be illuminated; and
   a backlight disposed between the reflector and the surface to be illuminated, the backlight comprising a light source and a waveguide, wherein the waveguide is configured to direct a majority of light from the light source toward the reflector,
   wherein the light source is positioned to emit light toward the reflector.

18. The device of claim 17 wherein the waveguide is a solid, transparent material.

19. The device of claim 17 wherein the wavelength converting material is disposed on the reflector in a plurality of regions, wherein neighboring regions are separated by regions of the reflector on which no wavelength converting material is disposed.

20. The device of claim 17 wherein the reflector is thermally conductive.

* * * * *